(12) United States Patent
Zhang et al.

(10) Patent No.: US 11,261,518 B2
(45) Date of Patent: Mar. 1, 2022

(54) METHOD AND AN APPARATUS FOR PRODUCING A FILM OF CARBON NITRIDE MATERIAL

(71) Applicant: City University of Hong Kong, Kowloon (HK)

(72) Inventors: Ruiqin Zhang, Kowloon (HK); Wei Xiong, Kowloon (HK); Miaoyan Huang, Kowloon (HK); Haoran Tian, Kowloon (HK)

(73) Assignee: City University of Hong Kong, Kowloon (HK)

( * ) Notice: Subject to any disclaimer, the term of this patent is extended or adjusted under 35 U.S.C. 154(b) by 98 days.

(21) Appl. No.: 16/128,564

(22) Filed: Sep. 12, 2018

(65) Prior Publication Data
US 2020/0080188 A1 Mar. 12, 2020

(51) Int. Cl.
| | |
|---|---|
| C23C 14/22 | (2006.01) |
| C23C 14/06 | (2006.01) |
| C03C 17/22 | (2006.01) |
| H01L 21/02 | (2006.01) |

(52) U.S. Cl.
CPC ............ *C23C 14/22* (2013.01); *C03C 17/225* (2013.01); *C23C 14/0658* (2013.01); *C03C 2217/281* (2013.01); *C03C 2218/15* (2013.01); *H01L 21/02118* (2013.01)

(58) Field of Classification Search
CPC .................................................. C23C 14/0658
See application file for complete search history.

(56) References Cited

U.S. PATENT DOCUMENTS 5,652,061 A * 7/1997 Jeng .................... C23C 14/0021
  428/408
2016/0042849 A1* 2/2016 Wang .................. C23C 14/5806
  420/121

OTHER PUBLICATIONS

Zhuang, Talanta, Mar. 2017, V64, p. 458-462 (Year: 2017).*
Zhao, Advanced Materials, 2008, 9999, p. 1-5. (Year: 2008).*
Jinshui Zhang, et al, "Sol Processing of Conjugated Carbon Nitride Powders for Thin-Film Fabrication", Angewandte Chemie, (2015) 54, 6297-6301.
Jian Liu, et al, "Microcontact-Printing-Assisted Access of Graphitic Carbon Nitride Films with Favorable Textures toward Photoelectrochemical Application", Advanced Materials, (2015) 27, 712-718.
Juncao Bian, et al, "Thermal vapor condensation of uniform graphitic carbon nitride films with remarkable photocurrent density for photoelectrochemical applications", Nano energy (2015) 15, 353-361.
R.Q. Zhang, et al, "Semiconductor film and method of forming the same technical field", US Patent, filed Feb. 22, 2016, U.S. Appl. No. 15/049,435.

* cited by examiner

*Primary Examiner* — Joseph A Miller, Jr.
(74) *Attorney, Agent, or Firm* — Renner Kenner Greive Bobak Taylor & Weber

(57) ABSTRACT

A method of producing a film of carbon nitride material, including the steps of providing a precursor of the carbon nitride material in a reacting vessel and a substrate substantially above the precursor of the carbon nitride material; heating the reacting vessel, the precursor of the carbon nitride material and the substrate at the first predetermined temperature; and quenching the reacting vessel to reach the second predetermined temperature; wherein the film of carbon nitride material is formed on a surface of the substrate during the quenching of the reacting vessel.

14 Claims, 11 Drawing Sheets

METHOD AND AN APPARATUS FOR PRODUCING A FILM OF CARBON NITRIDE MATERIAL

TECHNICAL FIELD

The present invention relates to a method and an apparatus for producing a film of carbon nitride material, and particularly, although not exclusively, to an apparatus for producing a g-CN thin film using a thermal vapour condensation method.

BACKGROUND

Electronic devices such as transistors and photonic devices may be fabricated on different substrates by using thin film technologies. For example, multiple layers of different materials may be sequentially deposited or coated on the substrate, and an operational device may be fabricated when each of the deposited layers are properly patterned.

By using suitable technologies, thin films of different materials may be deposited on a substrate. For example, a metal-oxide layer may be deposited on a substrate using chemical vapour deposition. In another example, a polymer layer may be deposited on a substrate using a solution method.

SUMMARY OF THE INVENTION

In accordance with the first aspect of the present invention, a method of producing a film of carbon nitride material is provided, comprising the following steps: providing a precursor of the carbon nitride material in a reacting vessel and a substrate substantially above the precursors of the carbon nitride material; heating the reacting vessel, the precursors of the carbon nitride material and the substrate at the first predetermined temperature; and quenching the reacting vessel to reach the second predetermined temperature; wherein the film of carbon nitride material is formed on a surface of the substrate during the quenching of the reacting vessel.

In an embodiment of the first aspect, the carbon nitride material includes graphitic carbon nitride.

In an embodiment of the first aspect, the first predetermined temperature is higher than or equals to a sublimation point of the precursors of the carbon nitride material.

In an embodiment of the first aspect, the first predetermined temperature is at 300-650° C.

In an embodiment of the first aspect, the second predetermined temperature is at room temperature.

In an embodiment of the first aspect, the entire process of producing the film of carbon nitride material is carried out under an atmospheric pressure.

In an embodiment of the first aspect, the precursors of the carbon nitride material includes at least one of melamine, urea, thiourea, thiosemicarbazide, dicyandiamide and cyanamide.

In an embodiment of the first aspect, the steps of providing the substrate and the precursor of the carbon nitride material in the reacting vessel: disposing the precursor of the carbon nitride material in a crucible; and providing the substrate substantially above the precursors of the carbon nitride material in the crucible.

In an embodiment of the first aspect, the substrate is arranged to substantially cover the crucible.

In an embodiment of the first aspect, the method further comprises the step of polishing an opening of the crucible such that the substrate is further arranged to substantially seal the crucible.

In an embodiment of the first aspect, the step of heating the reacting vessel comprising the step of heating the crucible, the substrate and the precursor of the carbon nitride material in a furnace at the first predetermined temperature.

In an embodiment of the first aspect, the method further comprises the step of maintaining the furnace at the first predetermined temperature for a predetermined period of time.

In an embodiment of the first aspect, the predetermined period of time is shorter than or equal to 20 minutes.

In an embodiment of the first aspect, the method further comprises the step of preparing a mash including the precursor of the carbon nitride material.

In an embodiment of the first aspect, the crucible includes a ceramic, glass or metal crucible.

In an embodiment of the first aspect, the substrate includes at least one of FTO glass, carbon cloth, silica, ITO glass and metal.

In accordance with a second aspect of the present invention, there is an apparatus provided for producing a film of carbon nitride material, comprising: a reacting vessel arranged to accommodate a precursor of the carbon nitride material therein and a substrate disposed above the precursor of the carbon nitride material; and a heater arranged to heat up the reacting vessel, the precursor of the carbon nitride material and the substrate; wherein the film of carbon nitride material is formed on a surface of the substrate during a quenching process of the reacting vessel.

In an embodiment of the second aspect, the carbon nitride material includes graphitic carbon nitride.

In an embodiment of the second aspect, the heater is arranged to heat up the reacting vessel at the first predetermined temperature higher than or equals to a sublimation point of the precursor of the carbon nitride material.

In an embodiment of the second aspect, the reacting vessel is quenched at the second predetermined temperature equals to room temperature.

In an embodiment of the second aspect, the entire process of producing the film of carbon nitride material is carried out under an atmospheric pressure.

In an embodiment of the second aspect, the precursor of the carbon nitride material includes at least one of melamine, urea, thiourea, thiosemicarbazide, dicyandiamide and cyanamide.

In an embodiment of the second aspect, the precursor of the carbon nitride material is in form of powders and/or a mash.

In an embodiment of the second aspect, the reacting vessel includes a crucible.

In an embodiment of the second aspect, the crucible includes a ceramic, glass or metal crucible.

In an embodiment of the second aspect, the crucible is substantially covered by the substrate.

In an embodiment of the second aspect, the crucible is substantially sealed by the substrate.

In an embodiment of the second aspect, the heater includes a furnace.

In an embodiment of the second aspect, the substrate includes at least one of FTO glass, carbon cloth, silica, ITO glass and metal.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

Figure 1C:
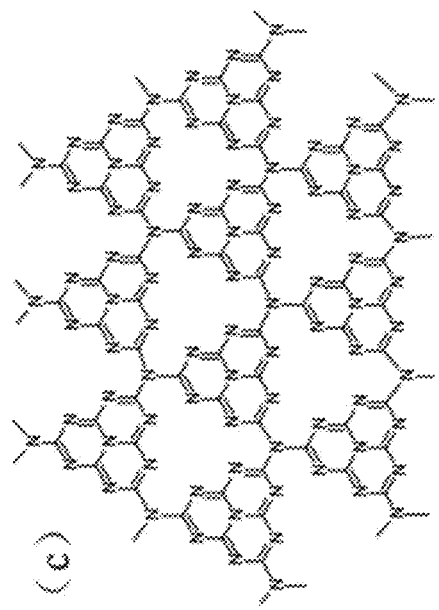
FIGS. 1A to 1C are structural diagrams showing the chemical structures of s-triazines, a tris-s-triazines unit and g-CN, respectively.

The inventors have, through their own research, trials and experiments, devised that, thin film materials have been an important branch of material science with special material properties. It can be deposited on the surface to change the surface properties of materials. With the continuous improvement of preparation technology, different materials can be made into thin films.

The film material is relative to the bulk material. It is a material layer which is deposited or prepared on the surface of the matrix material with a special method, which makes it different from the matrix material. The preparation of functional thin films with special properties is the main direction of thin film research. It has broad application prospects, which is closely related to the following characteristics of thin film materials.

In many cases, the function of the material is manifested on the surface of the material, such as wear protection, chemical catalysis, optical reflection, field emission, thermal electron escape and other physical and chemical phenomena. Moreover, using functional thin-film materials can save resources and reduce costs than functional bulk materials.

Thin film materials may also have properties that bulk materials do not possess. This is because thin films may tend to form a fine-grained and amorphous state. Thin films may also deviate from stoichiometry and have special surface energy states.

High-quality thin films may be more useful for thin film devices. With the application of laser technology, microwave technology, and particle beam technology, the preparation technology and methods of many kinds of thin film materials have been developed, which are mainly divided into physical and chemical methods. Physical methods such as vacuum evaporation, ion plating, RF sputtering, magnetron sputtering, electron beam sputtering, electron beam evaporation, molecular beam epitaxy and laser precipitation, such as chemical vapor deposition, sol-gel technology, homogeneous precipitation, etc.

Carbon and nitrogen may be considered as essential elements of all living substances. In nature, carbon and nitrogen may combine to form a carbon and nitrogen atom ring, and the energy of the system is reduced by connecting with other elements (such as H and O) to form a stable compound. The carbon and nitrogen elements are small in radius and are easy to form strong covalent bonds. It can form isotropic and dense three-dimensional covalent grid structure through four-fold coordination, forming a lot of stable organic compounds.

Carbon nitride, as a polymer derivative, has advantages of low density, good chemical inertness, and biological compatibility. However, due to the multiphase coexistence in the synthesis process, the molecular structure of some carbon nitride may be not preferable for some applications.

Preferably, the empirical calculation formula of the solid elastic modulus and the first-principal pseudopotential method may be applied to predict the carbon nitride and its ideal structure $\beta$-$C_3N_4$. In this method, $\beta$-$Si_3N_4$ may be considered as the structural model and C atoms may be substituted for the position of Si. The structure model of $\beta$-$C_3N_4$ was proposed. Moreover, on this basis, the bulk modulus of $\beta$-$C_3N_4$ may be estimated at B=4.27~4.83 Mbar and its upper limit exceeds that of diamond (theoretical value 4.35 Mbar, experimental value 4.43 Mbar).

$C_3N_4$ of different phases may be obtained, namely, a phase, $\beta$ phase, cubic phase, quasi-cubic phase and graphitic phase (g-CN). In addition to g-CN, the other four structures of $C_3N_4$, are super hard materials and have good chemical inertness, and their stability is higher than that of diamond, which can compensate for the lack insufficient thermal stability of the diamond. An example theoretical calculation shows that the indirect band gap (6.4 eV) and the direct band gap (6.75 eV) are larger than the minimum bandwidth of the diamond, which indicates that the $\beta$-$C_3N_4$ may be a transparent superhard material.

Moreover, because of its low symmetry in structure, it may have large nonlinear optical coefficients. These excellent physical and chemical properties make carbon nitride have wide potential applications in the field of mechanical, optical and electro-optical materials.

On the other hand, from the energy point of view, g-CN is the most stable at normal temperature and atmospheric pressure. It has excellent wear resistance, chemical stability, and thermal stability. It may be preferable to replace amorphous carbon and graphite carbon materials in the application of various materials. It can be applied to high-performance wear resistant coating, catalyst, catalyst carrier and synthetic metal nitride, or carbides, such as nitrogen source, membrane material or gas storage, etc.

The photoelectrochemical properties of carbon nitride have also been investigated. Graphitic carbon includes an advantageous property because of its appropriate band gap (2.7 eV). For $TiO_2$, which is considered to be the most investigated photoanode material, its band gap is 3.0 eV for rutile phase and 3.2 eV for anatase phase, which makes it only be able to absorb the light in UV region. Therefore, g-CN may be more suitable for visible light absorption due to its higher utilization of solar energy. Moreover, g-CN has various advantages, such as good thermal and chemical stability, low cost, nontoxicity and environmental compatibility. In addition, it may be used as an organic semiconductor, or a photocatalyst for solar fuel conversion and pollutant degradation.

Preferably, g-CN materials may be synthesized using different methods. With reference to FIGS. 1A and 1B, s-triazines ($C_3N_3$) and tris-s-triazines ($C_6N_7$) may be considered as the basic units constituting g-CN allotropes. Because the size of the nitrogen-containing pores in the two structures and the electronic environment of the nitrogen atoms are different, the stability of them is also different.

Figure 1B:
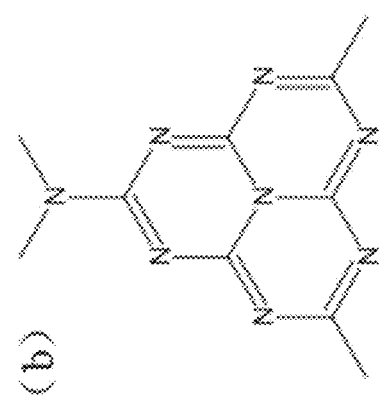
Figure 1A:
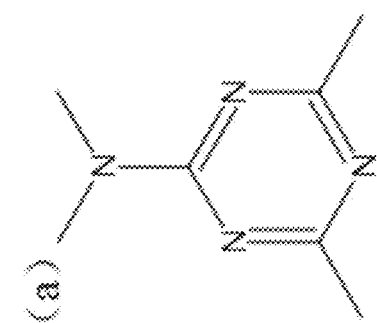

With reference also to FIG. 1C, density functional theory may be used to calculate that g-CN with tris-s-triazines ring ($C_6N_7$) as the structural base is about 30 K J/mol lower than the g-CN with s-triazines ring ($C_3N_3$) as the structural element, that means the g-CN with tris-s-triazines ring as the structural element is more stable. Therefore, the tris-s-triazines ring may be considered as the basic unit of g-CN sheet. g-CN has a layered structure with a graphitic structure with tris-s-triazines rings between the lamellae. The rings form a layer of infinite expansion through the N atoms at the end.

Graphitic carbon nitride materials may be prepared with various carbon and nitrogen sources as well as a variety of synthetic routes. For example, these methods may include ion-assisted synthesis, reactive sputtering, laser ablation, hot filament CVD and electron cyclotron resonance (ECR). With these preparation methods, $CN_x$ films may be obtained, and a few nano-scale CN grains may be embedded in the amorphous films.

Organic compounds containing three s-triazines or tris-s-triazines as precursors may be used, which are synthesized by means of gas phase deposition, solvothermal method, solid phase synthesis and thermal decomposition. Preferably, the precursor of melamine derivatives may be thermally decomposed at 400-650° C. to obtain amorphous carbon nitride. Alternatively, melamine and cyanuric chloride may be used as the raw material, carbon nitride polymer with s-triazines ring as the structural unit may be obtained under the condition of 250° C. and 140 MPa. Such method may be used in large batch preparation.

Yet alternatively, better graphite structure of carbon nitride may be prepared by decomposing melamine at 800° C. and 2.5 GPa, however, the carbon content in the matter is high, which may lead to uneven distribution in the plane.

Carbon nitride may also be prepared by solid-state reaction of cyanogen and calcium cyanide at 500~550 C. In this example, the ratio of C/N atoms reached 0.75, which may further optimize the order of graphite structure and the composition.

In an alternative embodiment, the solid reaction of melamine and cyanuric chloride may be carried out under the conditions of 500-600° C. and 1-1.5 GPa to prepare crystalline carbon nitride derivatives of the graphite structure. In this example, HCl formed in the reaction process may act as the template when the s-triazines condensation is formed on the nitride surface. The s-triazines ring is connected by the N—H group and the Cl ions were filled in. When $C_3N_3Cl_2NH_2$ is used as the precursor, the same product may also be obtained.

In another exemplary embodiment, a highly ordered array of carbon nitride ($C_9H_{14}N_{124}$) may be obtained through 700° C. thermal decomposition of melamine, and a similar product may be obtained for the thermal decomposition of melamine and $ZnCl_2$ mixture. In addition, a highly crystalline g-CN with tris-s-triazines ring as the structural unit may be prepared by the polycondensation and pyrolysis of the oxazine ring derivatives. In order to obtain low nitrogen content of synthetic products, nitrogen intermediates may be used as precursors to prepare nitrogen compounds. For example, carbon nitride materials may be prepared with a high nitrogen content network structure by using triaziazyltriazine ($C_3N_3(N_3)_3$).

Moreover, carbon nitride with different micro-structures may be synthesized, such as microspheres, nanowires, nanotubes, hollow spheres, and fibers. For example, a nanocomposite hollow graphite sphere-like graphite carbon nitride may be prepared by solid-phase reaction of cyanuric chloride and lithium azide. Crystalline carbon nitride nanobelts may be prepared by solid-phase reaction of cyanuric chloride, sodium azide and zinc at 220° C. and 400 MPa. In another example, porous silicon and mesoporous silica as templates may be used to prepare mesoporous graphite phase carbon nitride nanoparticles with different sizes from cyanamide.

The high-temperature self-polymerization of cyanamide monomers may be a more preferable method for the synthesis of bulk $g-C_3N_4$. Preferably, this pyrolysis method using a liquid monomer (cyanamide) as a precursor. By combining with a hard template, nanostructured g-CN with a high specific surface area and specific morphology may be prepared, such as nanospheres and mesoporous materials, etc.

Figure 2:
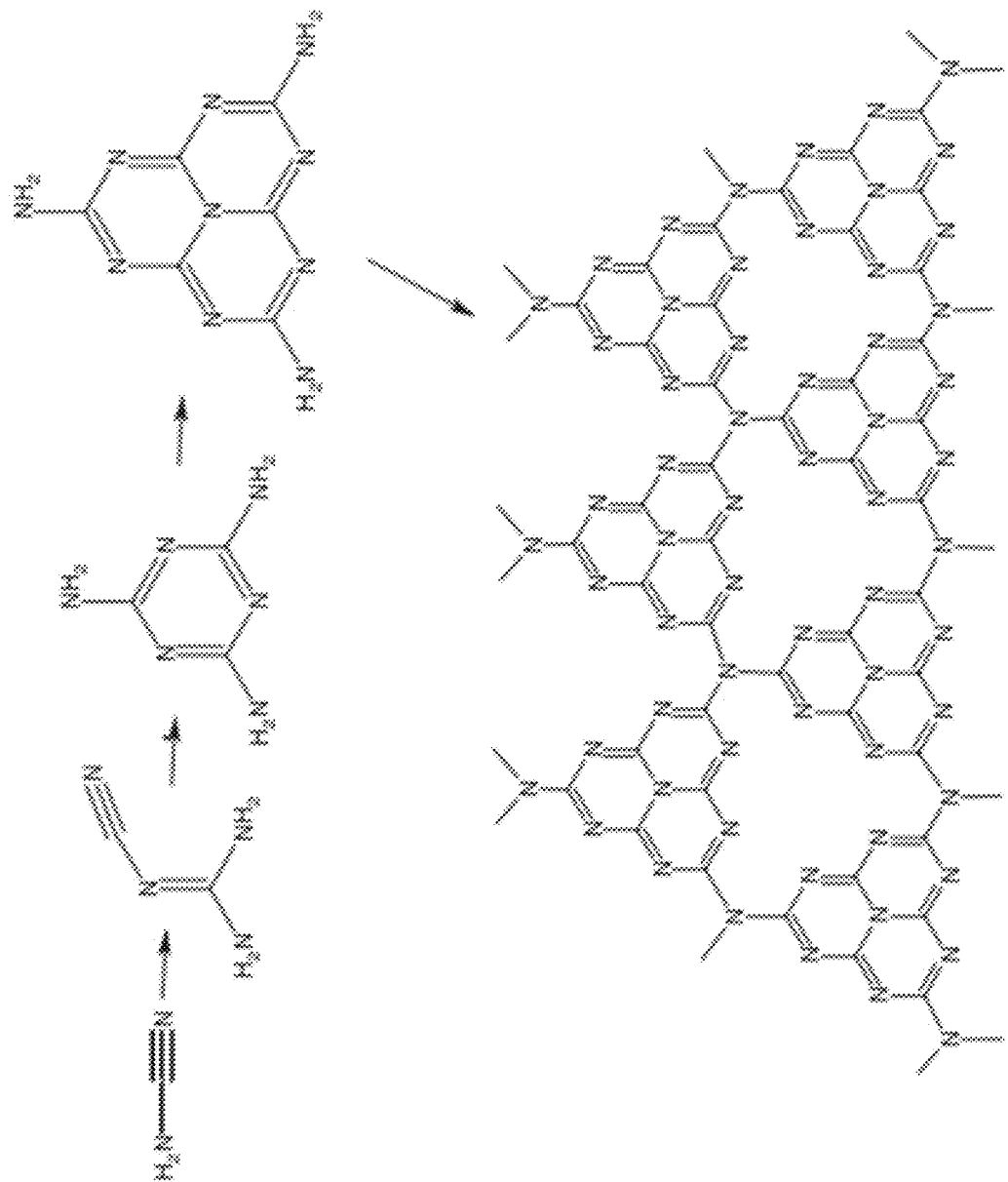
FIG. 2 is an illustration showing a reaction path for the formation of g-CN prepared by cyanamide.

With reference to FIG. 2, there is a reaction process of polycondensation and condensation. Firstly, the precursor is polymerized to form melamine at about 235° C., followed by the deamination and condensation process. When the temperature reached 350° C., a melam polymer ($C_6N_{11}H_9$) is formed. Heating to around 390° C., the melam formed melem ($C_6N_{10}H_6$) by rearrangement, which is a stable intermediate product. Preferably, in a closed reaction system, the partial pressure of ammonia is higher, and the stable melem polymerization product can be separated by stopping the reaction at 400° C. On the other hand, if the polymerization is carried out in an open reaction system, the equilibrium of the reaction moves toward the formation of oligomers or polymers due to the lower partial pressure of ammonia.

In this example, at temperatures above 520° C., melem further polymerizes into layered $C_3N_4$ polymers. The $C_3N_4$ polymer has a tris-s-triazines ring as the basic structural unit, and the edge of the C—N sheet is connected to a hydrogen atom in the form of C—$NH_2$ or 2C—NH. The synthesis of g-CN from cyanamide is a complex polycondensation process, with different degrees of polycondensation coexisting in a wide range of temperature. Therefore, it may be difficult to have only a single molecular structure of carbon-nitrogen products in the polymerization process. When the temperature is higher than 600° C., the resulting material is unstable and the material begins to decompose slightly. At temperatures above 700° C., the material is completely decomposed into $NH_3$ and $C_xN_yH_z$ gas. Preferably, 550-600° C. may be the optimal synthesis temperature for bulk g-CN.

Figure 3:
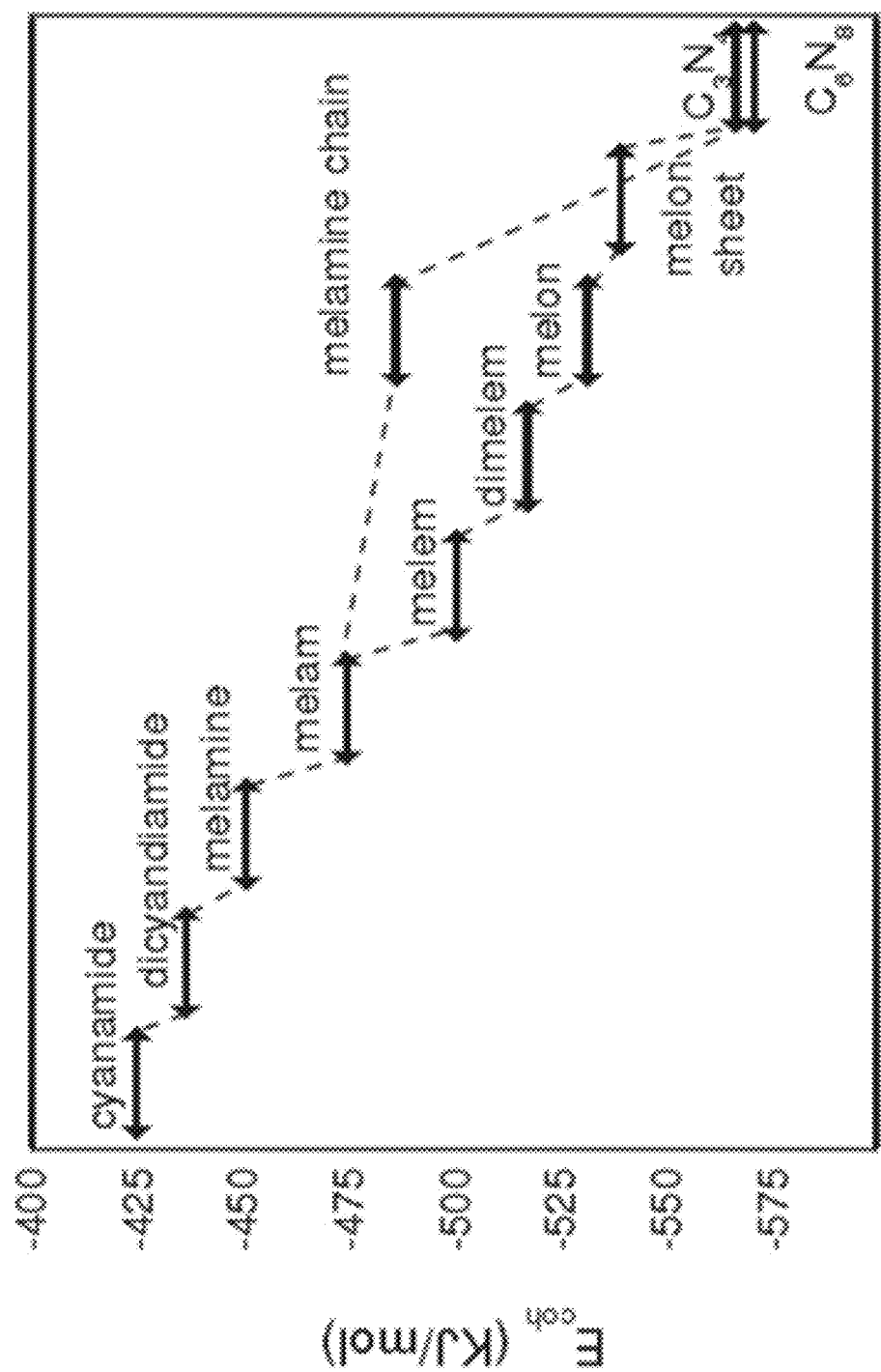
FIG. 3 is a plot showing calculated energy for the synthesis of carbon nitride, the starting precursor cyanamide is condensed into melamine, further condensation can then produce via the triazine route to $C_3N_4$, or melamine can form melem and then follow the tri-s-triazine route (dashed line) to form $C_6N_3$.

This polyaddition and polycondensation reaction process has also been further verified by first-principles with pseudopotentials method. With reference to FIG. 3, theoretically, it is shown that the binding energy of the molecule increases with the degree of polyaddition. There may be two reaction paths. First, melamine polymerization forms melamine first, and melamine is further polycondensed to form the metastable intermediate melam, which is then heat-polycondensed to produce melem, and finally melem is polycondensed into layered polymerized $C_3N_4$ under high temperature. Second, melamine forms a melamine chain first, and a layered polymerized $C_3N_4$ is formed through the triazine path.

According to the mechanism of cyanamide polycondensation, a thermal vapor condensation (TVC) method may be used. By maintaining temperature and the heating and cooling rate, the thickness and properties can be controlled. The reaction conditions may be vacuum-free. The warming and cooling process may be removed in some example embodiments.

Figure 4A:
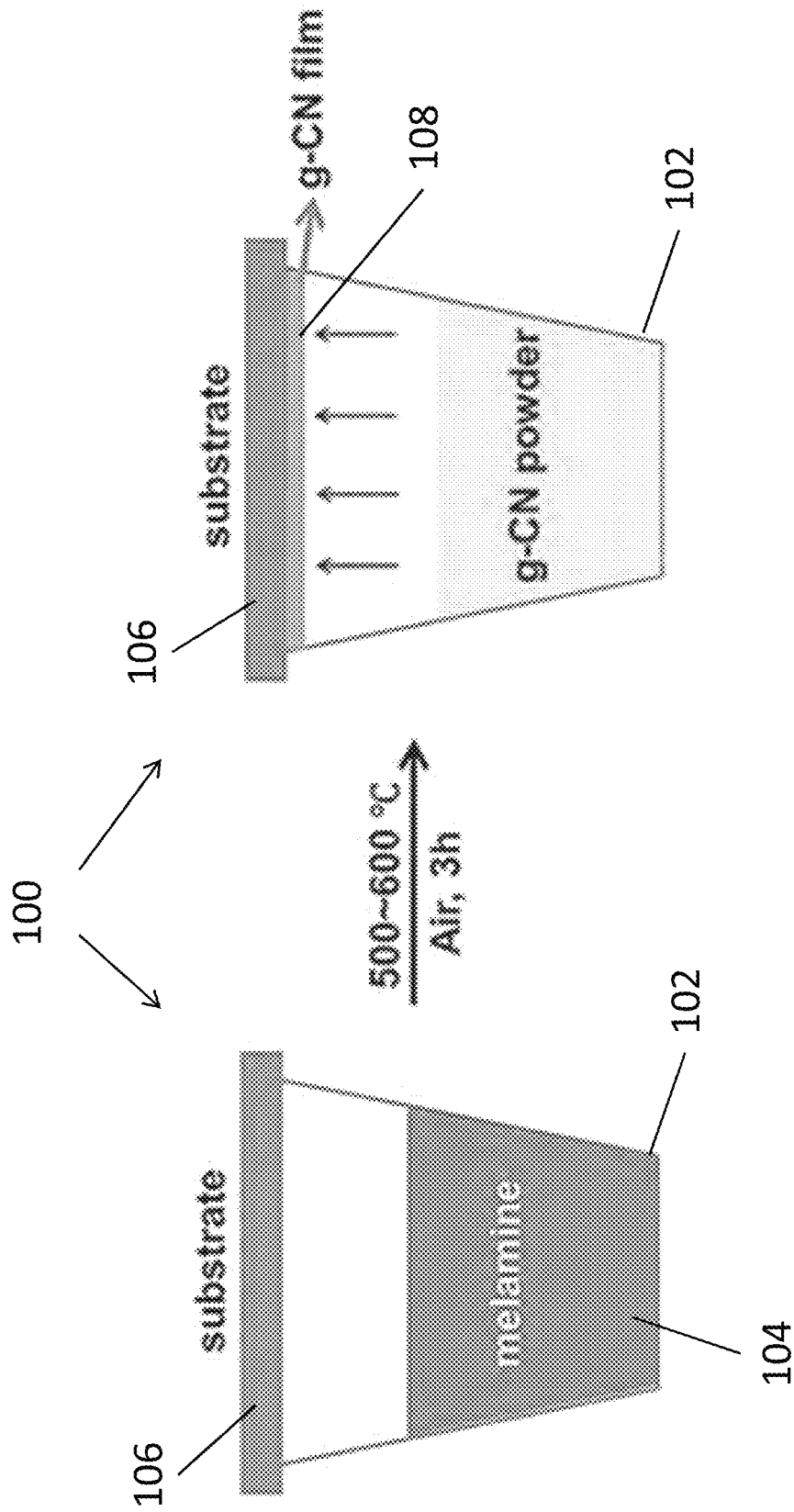
FIGS. 4A and 4B are illustrations showing a method and an apparatus for producing a film of carbon nitride material on a substrate in accordance with two preferred embodiment of the present invention.
Figure 4B:
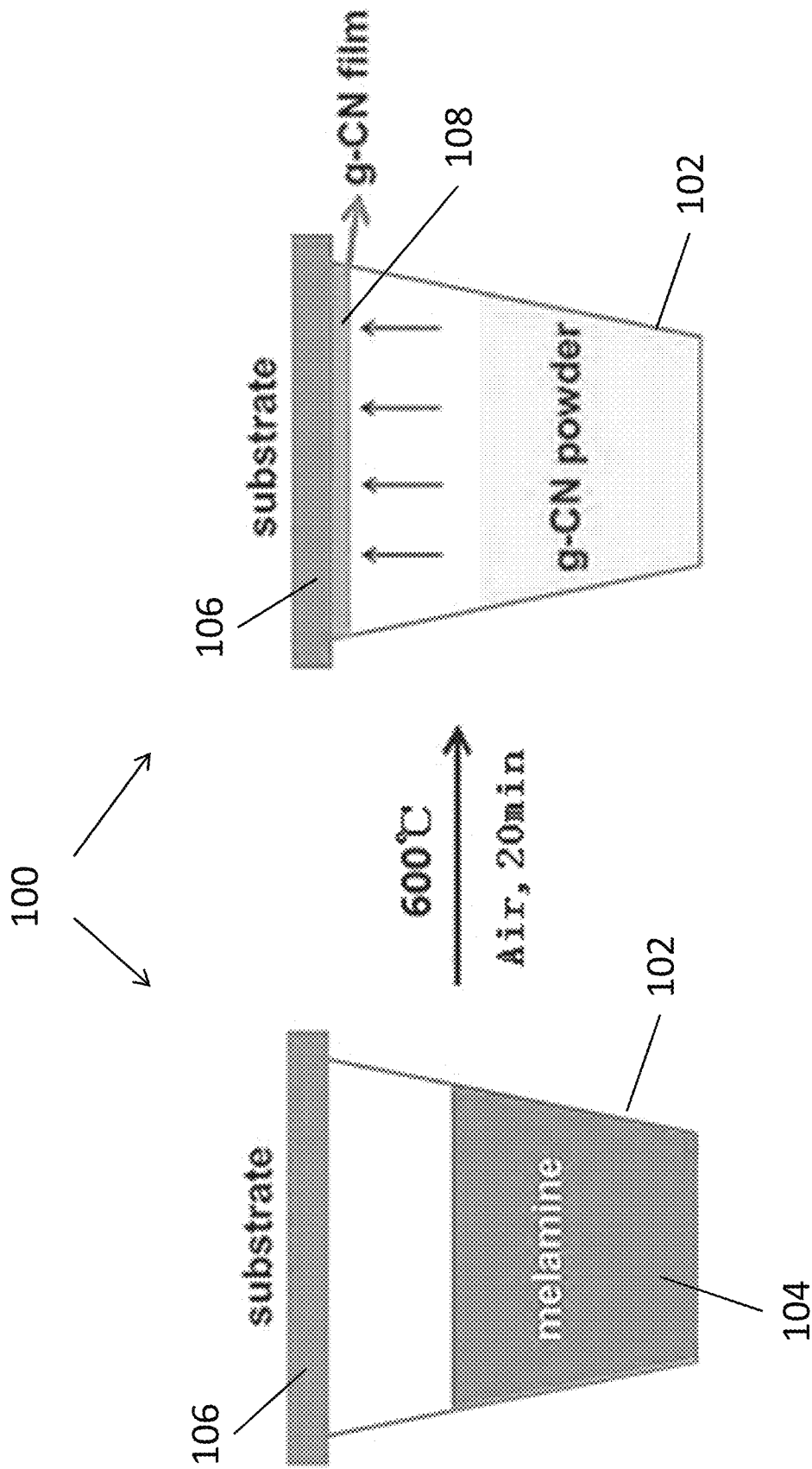

With reference to FIGS. 4A and 4B, there is shown two embodiments of an apparatus 100 for producing a film of carbon nitride material, comprising a reacting vessel 102 arranged to accommodate a precursor of the carbon nitride material 104 therein and a substrate 106 disposed above the precursor of the carbon nitride material 104; and a heater (not shown) arranged to heat up the reacting vessel 102, the precursor of the carbon nitride material 104 and the substrate 106; wherein the film of carbon nitride material 108 is formed on a surface of the substrate 106 during a quenching process of the reacting vessel 102.

In this embodiment, carbon nitride film, including graphitic carbon nitride film 108 may be fabricated on a surface of a substrate 106, such as but not limited to fluorine-doped tin oxide (FTC)) glass, carbon cloth, silica, indium-doped tin oxide (ITO) glass and metal, and therefore the substrate 106 deposited with the g-CN thin film 108 may be further processed to other electronic or photonic devices.

Preferably, the entire process of fabricating or producing the carbon nitride thin film 108 on the substrate surface 106 includes covering a reacting vessel 102 with the substrate 106, heating the reacting vessel 102 so as to heat the precursor of the carbon nitride material 104 provided in the reacting vessel 102 to a predetermined temperature for certain period and finally quenching the reacting vessel 102. During the quenching process, the g-CN thin film 108 is formed on the surface of the substrate 106.

Referring to FIG. 4A, the first preferable embodiment using a thermal vapor condensation (TVC) method is shown. In this embodiment, a crucible 102 (such as a ceramic, glass or metal crucible) is used as the reacting vessel which contains the precursor material 104, and the crucible 102 is substantially covered by the substrate 106. The substrate 106 substantially seals the crucible 102 by creating a substantially enclosed reacting environment.

The crucible 102 may be placed in a furnace (not shown), such as a muffle furnace which heat up the vessel 102 as well as the precursor 104 and the substrate 106 to a predetermined temperature. Preferably, the precursor 104 may be powders or mash, and the vessel 102 may be heated to reach a temperature higher than or equals to a sublimation point of the precursor of the carbon nitride material 104, such that the solid precursor 104 sublimes to a gaseous state and fills up the reacting vessel 102 with the precursor material 104. Alternatively, when liquid precursor is used, such heating temperature may be set at a point sufficient for evaporating or vaporizing the precursor material.

For example, referring to FIG. 4A, the reactor or the reacting vessel 102 may be covered by an FTO glass substrate 106 with the preferred side facing downward. Melamine may be used as the precursor of the carbon nitride material 104. The temperature goes through a ramp process from room temperature to 500-600° C. When it reaches the sublimation point, melamine vapor will be generated. Then the reactor 102 will be filled with a relatively saturated vapor. Nucleation and growth of g-CN film 108 occur on the surface of the FTO glass 106. Between the film 108 and the substrate 106, chemical bonds are formed. This is the reason for the intimate contact of the film 108 and FTO glass 106.

Preferably, the reacting vessel 102 is quenched at a second predetermined temperature such as at room temperature.

In this example, 50 g of melamine was put into a ceramic crucible (200 mL). Before the experiment, the crucible was well polished using an abrasive sheet so as to improve the seal between the crucible and the substrate for facilitating g-CN film formation. A piece of FTO glass of 10 cm, 10 cm and 0.32 cm, respectively, in length, width, and height, was uniformly covered on the top of the ceramic crucible. Then the setup were placed in a muffle furnace (carbolite) and maintained at 500° C., 550° C., or 600° C. for 3 h in air with heating and cooling rates of 3° C./min.

Preferably, the precursor is easily vaporized as one of a precondition for TVC to occur. In the above example, melamine may easily sublimate at high temperature. On the other hand, other monomers or precursors for the synthesis of g-CN powders such as urea, thiourea, and dicyandiamide thiosemicarbazide, may be used to form g-CN films on solid substrates.

The inventors found that $NH_2$ groups may play an important role in nucleation, thus the lack of $NH_2$ groups in each precursor molecule leads to failure to produce uniform g-CN film. Alternatively, other precursors of the carbon nitride material which includes an $NH_2$ functional group or other functional groups that may facilitate the nucleation of carbon nitride on a solid substrate may be used.

Preferably, the grain size, shape, thickness, and structure of the g-CN films may be further controlled by changing the reaction conditions, such as the final temperature or the second predetermined temperature of the quenching process, the heating rate, holding time or the heating period and the amount of precursors.

Preferably, the entire process of producing the film of carbon nitride material is carried out under an atmospheric pressure, i.e. vacuum free. It is more preferable to other chemical vapor deposition methods, which usually require a vacuum system or reacting chamber, and this may lead to a high processing cost for deposition of the films. Preferably, TVC may deliver highly uniform g-CN films on various substrates and may be used as a facile method to tune the morphology and thickness of the films.

In some fabricated thin films, a part of the photogenerated holes in the energy levels below HOMO cannot efficiently transfer to the electrolyte. To improve the performance of the device involving light absorption, the film thickness may be increased to micrometer scale.

With reference to FIG. 4B, in an alternative embodiment, the method of producing a film of carbon nitride material may be carried out using a rapid thermal vapor condensation (RTVC) method instead of the previous TVC method as shown in FIG. 4A.

In this embodiment, the temperature increase process is shortened, and the precursor 104 may be directly heated at a fixed temperature or the first predetermined temperature. For example, 500 mg of melamine powder may be prepared and made into 5 ml of mash, which may be further disposed in a small crucible 102, such as a 15 ml ceramic crucible. An FTO glass substrate 106 (with a size of 5 cm×5 cm×0.32 cm) may be used to cover and seal the crucible 102, and the entire setup may be put it directly into a furnace (not shown) set at 300-650° C. at a predetermined time period.

Preferably, the predetermined period of time is shorter than or equal to 20 minutes. After the temperature was maintained for 20 minutes, the reacting vessel 102 may be taken out and cooled to reach room temperature. As a result, a g-CN film 108 may be found covering the FTO glass slide 106.

Preferably, in the RTVC process, melamine may be heated rapidly to reach the sublimation point. Because of the rapid and efficient film formation, the total volume of precursors required may be further reduced. When the saturated vapor contacts with the FTO glass surface, it rapidly condenses to form a carbon nitride film.

Figure 5:
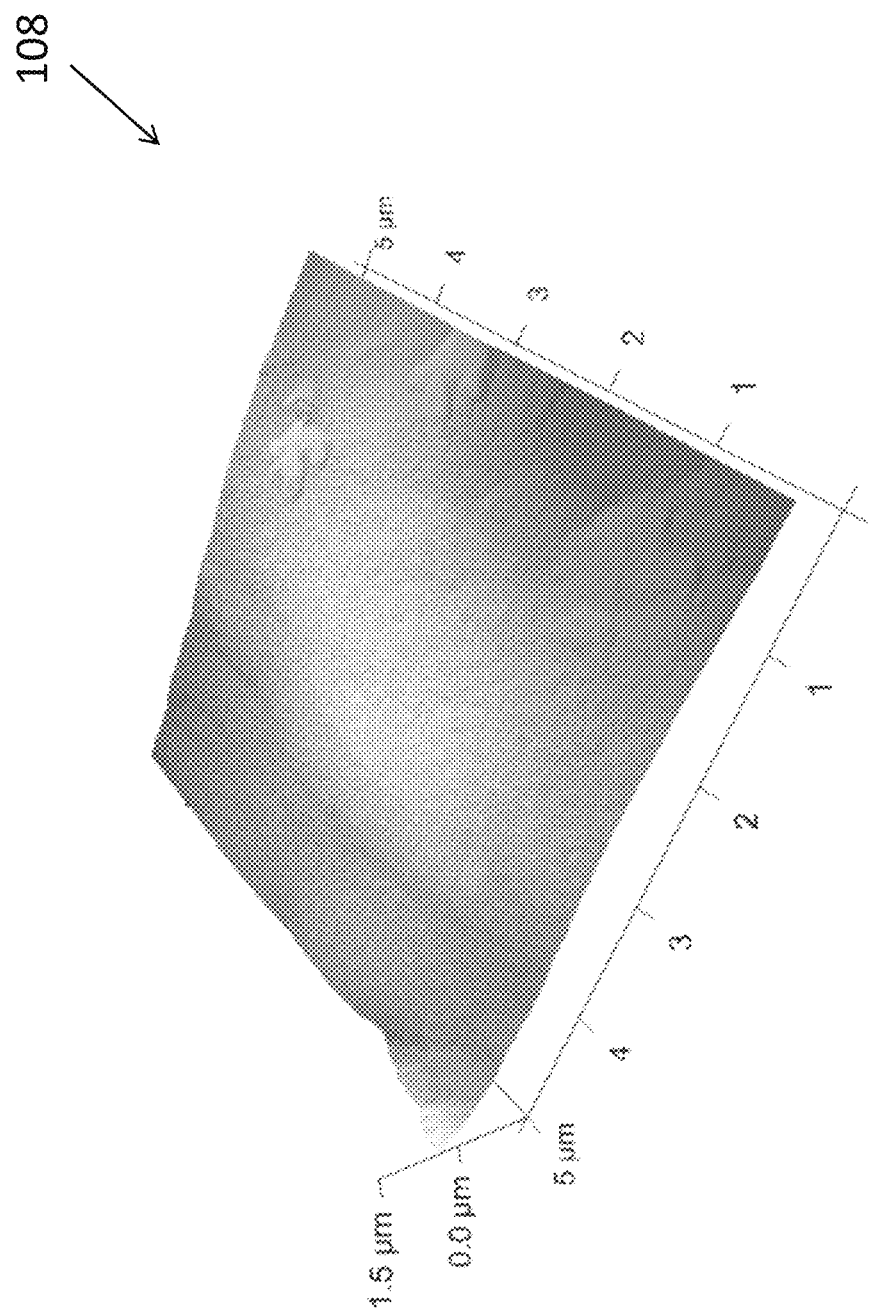
FIG. 5 is an image showing a three dimensional morphology of g-CN films on FTO glass produced in accordance with embodiments of the present invention.
Figure 6:
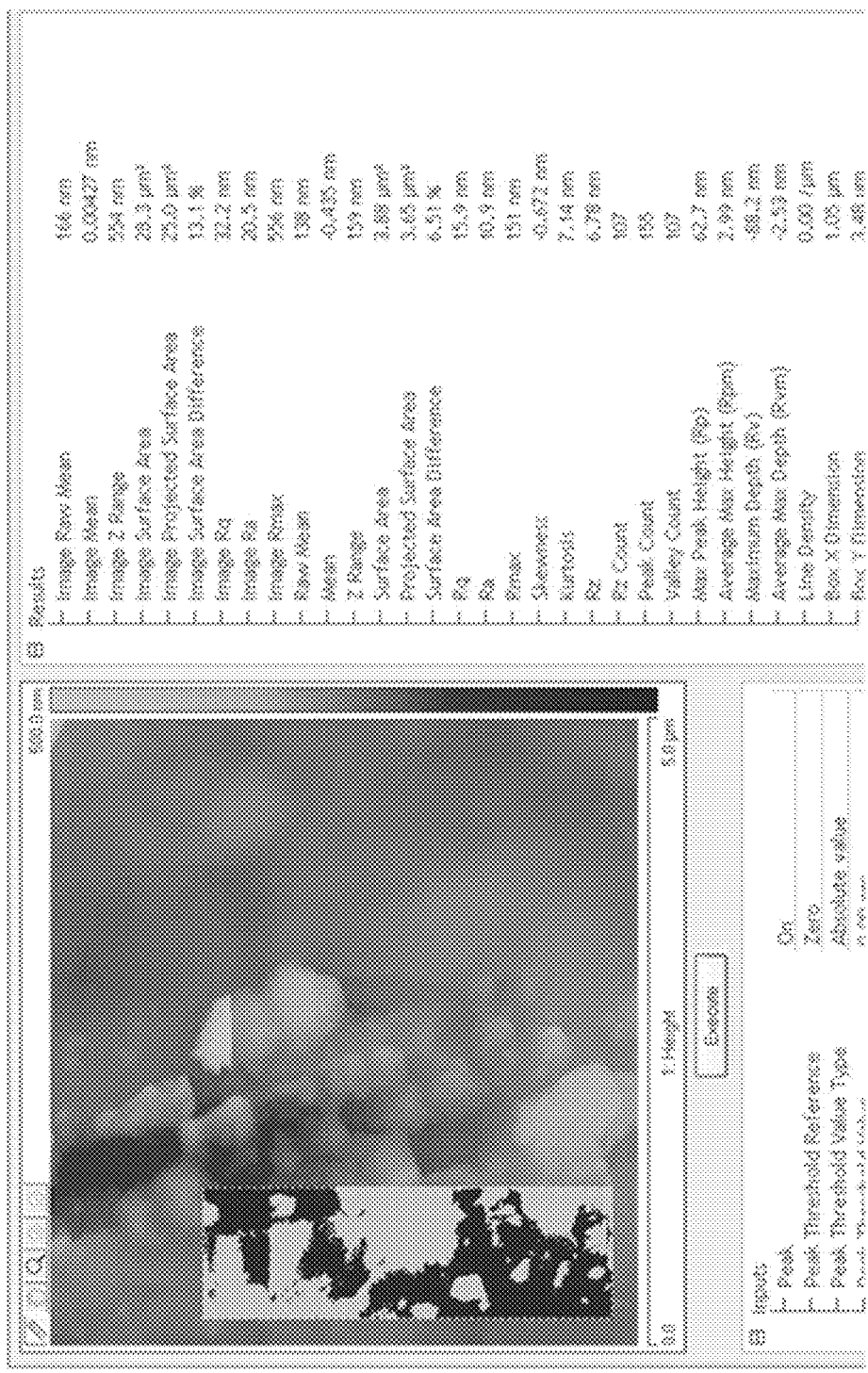
FIG. 6 is an AFM image showing AFM surface and the analytical data of the g-CN film of FIG. 5.

The inventors have also evaluated the material characteristics of the carbon nitride film produced using the methods in accordance with embodiments of the present invention. With reference to FIGS. 5 and 6, there is shown AFM images and the associated parameters of the morphologies of the g-CN films grown on FTO glass. The film was observed to be continuous with many nanoparticles on the surface. The surface roughness of the films is relatively high (Image Rq 32.3 nm, Image Ra 20.5 nm) because the thickness of the wave film has reached the micron level.

Compared with TVC, the thickness of the films prepared by RTVC increased significantly. At the same time, the roughness also increased, which enhances absorption of light.

Figure 7A:
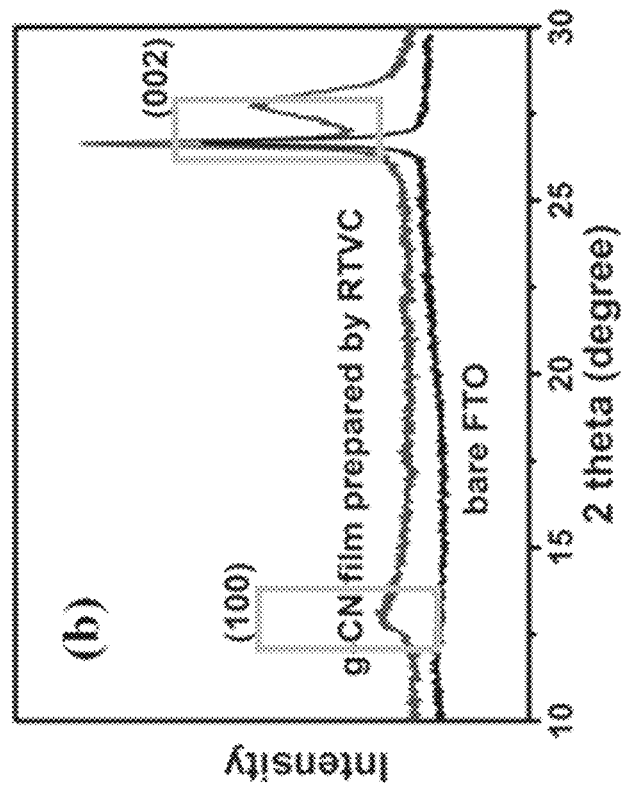
FIGS. 7A and 7B are plots showing XRD pattern of g-CN films prepared by TVC and RTVC respectively.
Figure 7B:
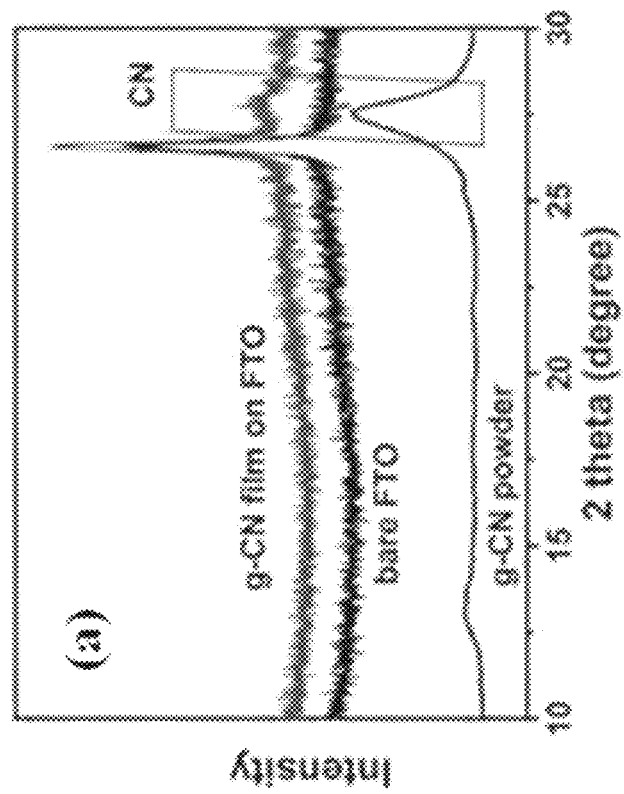

With reference to FIGS. 7A and 7B, there is shown XRD results measured on g-CN films prepared by the abovementioned thermal vapor condensation (TVC) method and the rapid thermal vapor condensation (RTVC) in accordance with embodiments of the present invention, respectively. The strong diffraction peak centered at $2\theta=27.69°$ is attributed to the stacked peak of the conjugated aromatic ring, which corresponds to the (002) crystal plane. It confirms that the film features a graphitic structure.

An increase of the diffraction peak of (002) indicates that a more complete (002) crystal surface has been formed, and the interlayer stacking is more orderly. There is also a slight shift of the interlayer reflection relative to g-CN powder ($2\theta=27.38°$). It is because that the effect of nanosize occurs when the interlayer distance decreases.

The diffraction peak centered on 12.9° is consistent with the (100) crystal plane of carbon nitride. Compared with the thin films prepared by TVC method, it is more obvious. From the diffraction peak, the film prepared by RTVC is closer to g-CN powders, indicating that all samples are graphite structured carbon nitride. Thus, RTVC is more helpful for the formation of crystal structure of carbon nitride film.

Figures 8A, 8B:
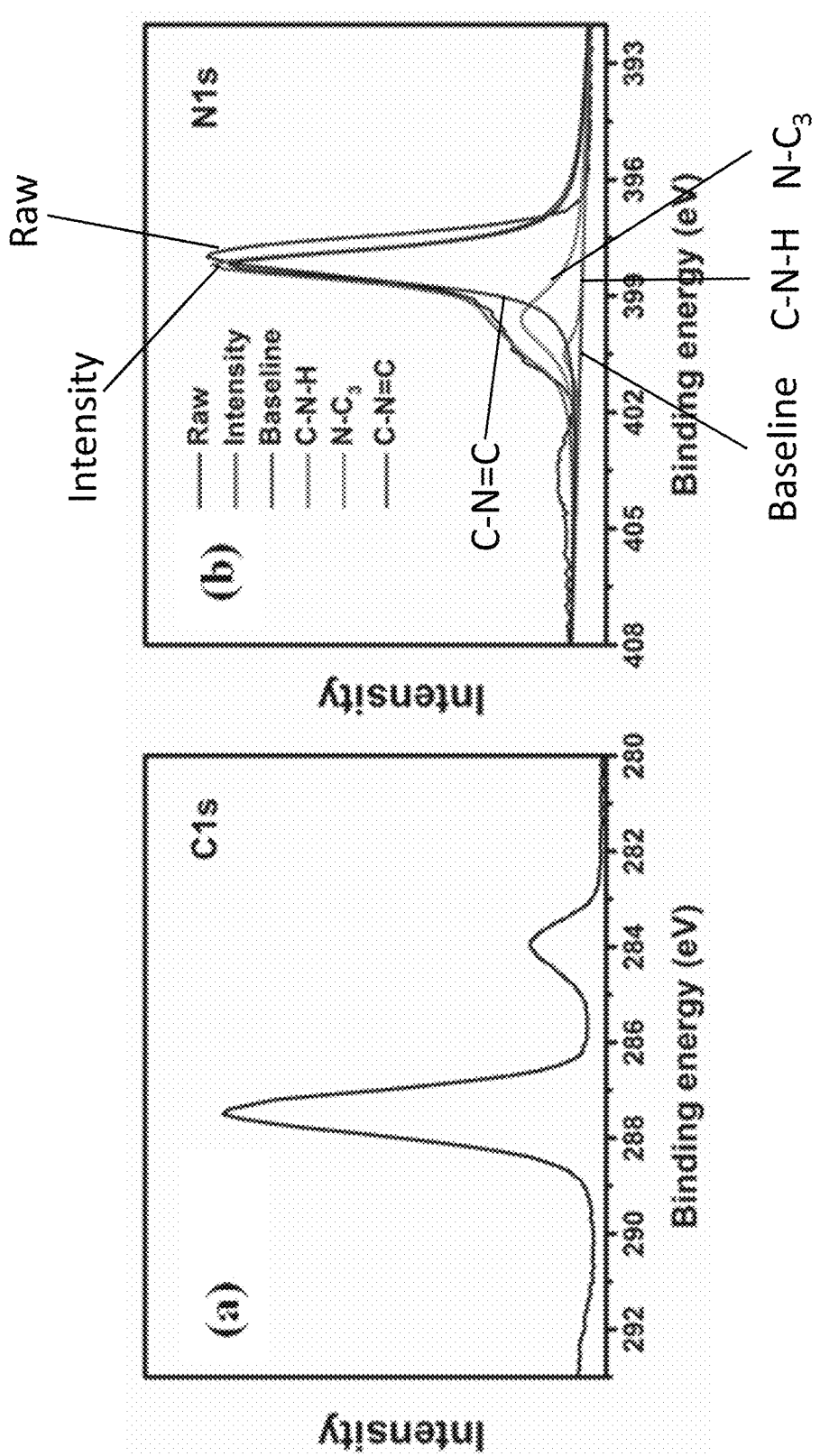
FIGS. 8A and 8B are plots showing C1s and N1s XPS spectra of g-CN film of FIG. 5.

To further reveal the chemical composition of the surface and the chemical environment of elements, X-ray photoelectron spectra (XPS) were characterized. With reference to FIG. 8A, the mainly carbon species centered at 288.7 eV are assigned to N-containing aromatic ring (N—C=N), respectively. Referring to FIG. 8B, the N1s spectrum of g-CN is deconstructed into three peaks located at 398.7 eV, 400.1 eV, 401.1 eV, which are assigned to $sp^2$-hybridized nitrogen in triazine rings (C—N=C), tertiary nitrogen N—$(C)_3$ groups, and amino functions carrying hydrogen (C—N—H).

The peak position of nitrogen bridging species (401.1 eV) shifts compared with CN (401.6 eV) in g-CN powder, which suggests an electron structural change for the g-CN film prepared by RTVC. These peaks provide further evidence for the nature of the tri-s-triazine-constructed structure.

Figure 9A:
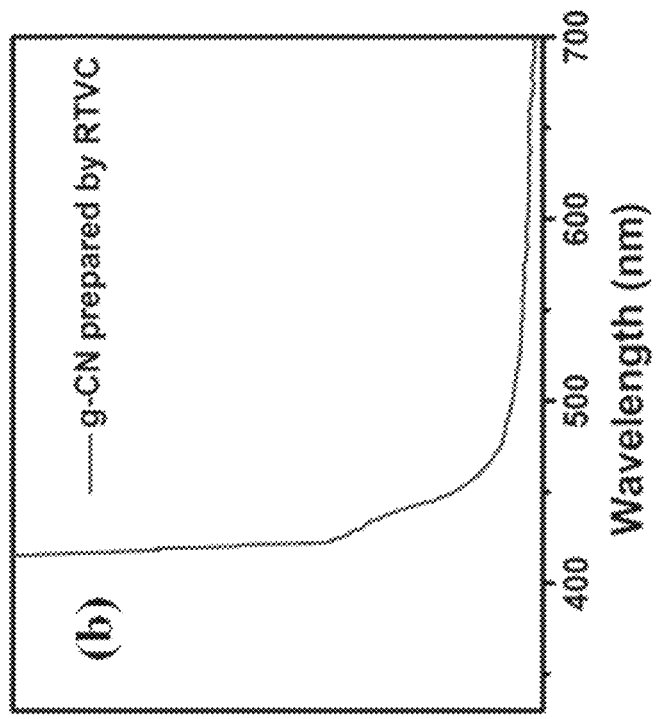
FIGS. 9A and 9B are plots showing UV/Vis absorption spectra of g-CN films of different thickness prepared by TVC and RTVC respectively.

The absorption edge that has been noted locates at approximately $\lambda=450$ nm. On the contrary, the absorption spectra of g-CN films mainly depend on the thickness. With reference to FIG. 9A, when the thickness of the film is over 1 mm, the absorption spectra will be similar to that of g-CN powders. However, when the thickness is under 100 nm, the absorption will experience a blue-shift. Strong absorption bands at $\lambda=307$ nm and two shoulders at $\lambda=366$ nm and 386 nm can be observed from a film (thickness: 55 nm)

The measured absorption bands closely match the calculated absorption bands. The differences between the wavelengths of the calculated bands and the measured ones are related to the sizes of the sheets and the thicknesses of the films, which may be considered as a nanosize effect of g-CN. For example, chemically exfoliated g-CN nanosheets (thickness: ≈5-35 nm, lateral dimensions: ≈40-220 nm) may exhibit an absorption spectrum similar to that of thin films (thickness: <100 nm) with one strong band at $\lambda=296$ nm and two shoulders at $\lambda=365$ and 380 nm.

Figure 9B:
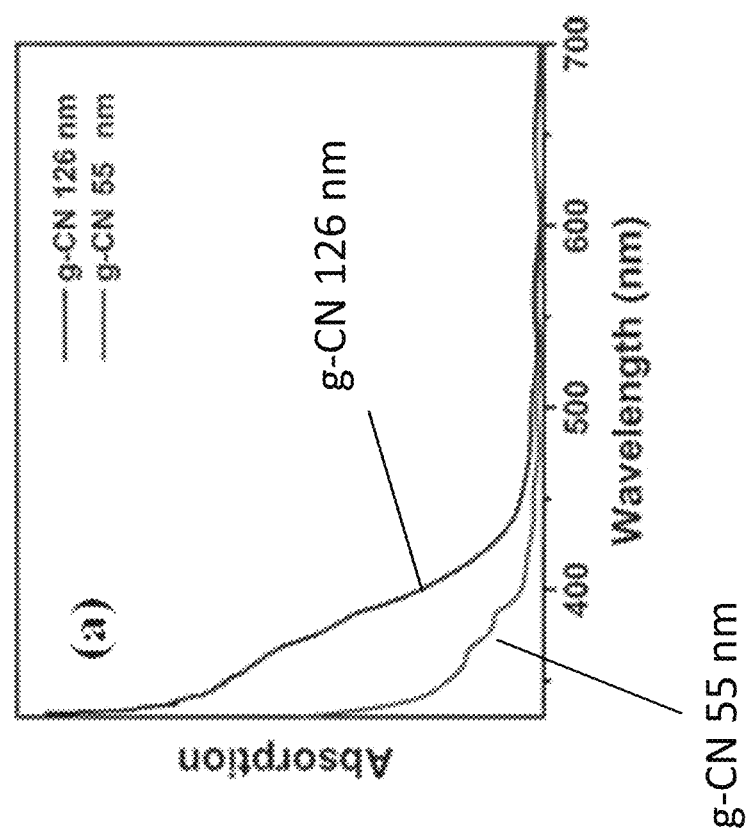

Theoretical calculations demonstrate that the energy bands would split into discontinuous energy levels. If bulk g-CN is exfoliated into thin nanosheets or if the film thickness decreases to less than 100 nm, the transition among the split energy levels becomes clear. With reference to FIG. 9B, the g-CN film prepared by RTVC shows a more significant red-shift, comparing with TVC method. In addition to the effect of thickness, the more stable crystal shape is the reason for the red-shift of the absorption spectrum.

These embodiments may be advantageous in that high quality g-CN thin film can be easily fabricated using a relatively simple setup, and the fabrication does not require a vacuum process. In addition, only a small amount of precursor material is required by using the RTVC method.

As can be seen in the morphologies, it is a continuous film with many nanoparticles on the surfaces. The thickness of the film has been enlarged to micrometer scale which is beneficial of the absorption of light.

The XRD patterns show that the g-CN film prepared by RTVC has a higher intensity the diffraction peak than that of TVC. The crystalline form is close to the g-CN powder.

The film has a standard tri-s-triazine-constructed structure with triazine rings (C—N=C), tertiary nitrogen N—$(C)_3$ groups, and amino functions carrying hydrogen (C—N—H). The UV-vis absorption spectra show a significant redshift, compared with ordinary TVC method.

By obtaining high quality g-CN film, different devices may be further fabricated using the substrate coated with g-CN, which has excellent wear resistance, chemical stability, and thermal stability. It is possible to replace amorphous carbon and graphite carbon materials in the application of various materials. It can be used in the synthesis of nitrogen source, catalyst, photocatalyst, catalyst carrier, high-performance wear-resistant coating, membrane material or gas storage.

Figure 10:
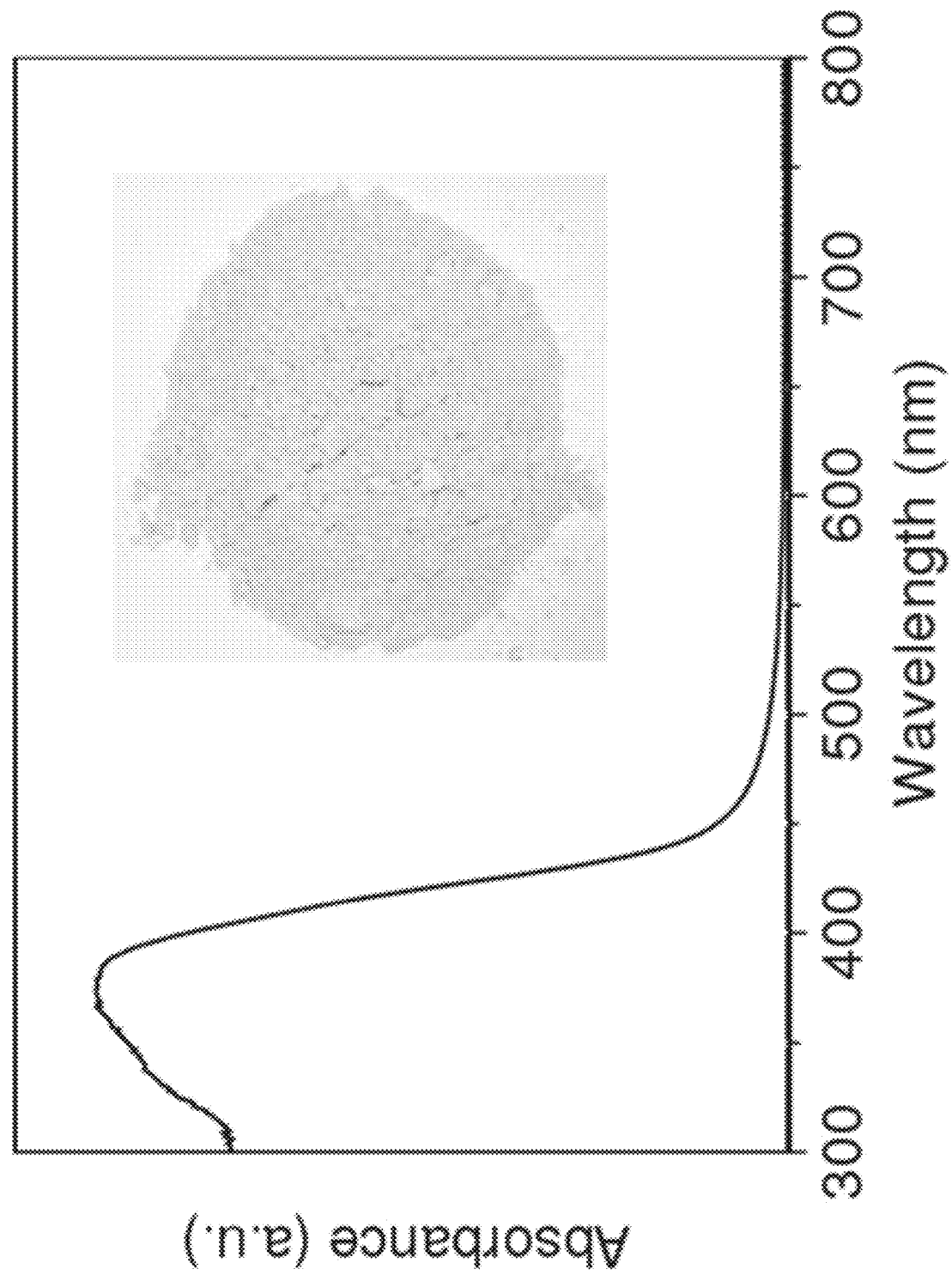
FIG. 10 is a plot showing an example Uv/vis spectra of g-CN powders.

Without wishing to be bound by theory, carbon nitride is an electronic rich organic semiconductor. With reference to FIG. 10, the optical absorption spectrum of the g-$C_3N_4$ polymer shows that it has an obvious absorption band around 460 nm, with a corresponding band gap of about 2.7 e V, which is greater than the decomposition voltage of water (the theoretical value is 1.23 e V). Besides the forbidden bandwidth, conduction and valence band position also affect the oxidation and reduction ability of semiconductor materials.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method of producing a film of carbon nitride material using a rapid thermal vapor condensation process, comprising the steps of:
    disposing a precursor of the carbon nitride material in a reacting vessel and a substrate substantially above the precursor of the carbon nitride material, wherein the reacting vessel includes a 15 mL crucible;
    heating the reacting vessel, the precursor of the carbon nitride material and the substrate at a first predetermined temperature for a predetermined amount of time shorter than or equal to 20 minutes; and
    quenching the reacting vessel to reach a second predetermined temperature;
    wherein the film of carbon nitride material is formed on a surface of the substrate during the quenching of the reacting vessel.

2. The method of claim 1, wherein the carbon nitride material includes graphitic carbon nitride.

3. The method of claim 1, wherein the first predetermined temperature is higher than or equals to a sublimation point of the precursor of the carbon nitride material.

4. The method of claim 3, wherein the first predetermined temperature is from 300 to 650° C.

5. The method of claim 1, wherein the second predetermined temperature is room temperature.

6. The method of claim 1, wherein the entire process of producing the film of carbon nitride material is carried out under an atmospheric pressure.

7. The method of claim 1, wherein the precursor of the carbon nitride material includes at least one of melamine, urea, thiourea, thiosemicarbazide, dicyandiamide and cyanamide.

8. The method of claim 1, wherein the step of providing the substrate and the precursor of the carbon nitride material of in the reacting vessel comprising the step of:
    disposing the precursor of the carbon nitride material in a crucible; and
    providing the substrate substantially above the precursor of the carbon nitride material in the crucible.

9. The method of claim 8, wherein the substrate is arranged to substantially cover the crucible.

10. The method of claim 9, further comprising the step of polishing an opening of the crucible such that the substrate is further arranged to substantially seal the crucible.

11. The method of claim 8, wherein the step of heating the reacting vessel comprising the step of heating the crucible, the substrate and the precursor of the carbon nitride material in a furnace at the first predetermined temperature.

12. The method of 1, further comprising the step of preparing a mash including the precursor of the carbon nitride material.

13. The method of claim 8, wherein the crucible includes a ceramic, glass or metal crucible.

14. The method of claim 1, wherein the substrate includes at least one of FTO glass, carbon cloth, silica, ITO glass and metal.

* * * * *